United States Patent
Paillet et al.

(10) Patent No.: US 6,828,857 B2
(45) Date of Patent: Dec. 7, 2004

(54) HIGH GAIN, HIGH BANDWIDTH CMOS TRANSIMPEDANCE AMPLIFIER

(75) Inventors: Fabrice Paillet, Hillsboro, OR (US); Tanay Karnik, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 88 days.

(21) Appl. No.: 10/317,763

(22) Filed: Dec. 11, 2002

(65) Prior Publication Data

US 2004/0113694 A1 Jun. 17, 2004

(51) Int. Cl.[7] .............................. H03F 3/18; H03F 3/08; H03F 3/26
(52) U.S. Cl. ........................ 330/264; 330/308; 330/271
(58) Field of Search ................................ 330/264, 308, 330/271

(56) References Cited

U.S. PATENT DOCUMENTS

| | | | | |
|---|---|---|---|---|
| 4,100,502 A | * | 7/1978 | Yamashiro | 330/264 |
| 4,535,233 A | * | 8/1985 | Abraham | 250/214 A |
| 5,745,010 A | * | 4/1998 | Miyamoto et al. | 330/294 |
| 5,963,094 A | * | 10/1999 | Linder et al. | 330/264 |

* cited by examiner

*Primary Examiner*—Patricia Nguyen
(74) *Attorney, Agent, or Firm*—Seth Z. Kalson

(57) ABSTRACT

A three-stage transimpedance amplifier, where the first stage is a shunt-shunt feedback amplifier, the second stage is a simple voltage amplifier, and the third stage is a shunt-shunt feedback amplifier. The third stage comprises a pMOSFET serially connected with a nMOSFET, where their gates are connected together and to the output port of the second stage, and comprises a feedback pMOSFET or resistor to provide negative feedback from the drains of the pMOSFET and nMOSFET to the output port of the second stage.

15 Claims, 11 Drawing Sheets

HIGH GAIN, HIGH BANDWIDTH CMOS TRANSIMPEDANCE AMPLIFIER

FIELD

The present invention relates to analog circuits, and more particularly, to amplifiers.

BACKGROUND

With increasing data rates in electronic systems, it is expected that optical interconnects (optical fibers) may in the near future replace wire interconnects at the board-to-board and chip-to-chip level. For example, a computer system such as that illustrated in FIG. 1 may comprise one or more boards 102 and memory hierarchy 104 that exchange data packets over optical interconnects 106. These packets may be routed via switch 108, or perhaps the various integrated circuits may be directly connected to one another. In the example of FIG. 1, each board 102 comprises I/O circuit or board 110, and comprises one or more microprocessors, e.g., microprocessor 112, in communication with its corresponding I/O circuit.

An I/O circuit utilizes an optical transceiver, comprising an optical transmitter for up-converting an electrical signal to an optical signal, and an optical receiver for down-converting an optical signal to an electrical signal. An optical receiver usually comprises a photodetector to provide an electrical signal indicative of a received optical signal. A typical small-signal model for a photodetector is provided in FIG. 2, comprising small-signal current source 202 and parasitic capacitor 204. The small-signal current provided by current source 202 is representative of the received optical signal. The output current signal is provided at output port 206.

The output signal provided by the photodetector is amplified to a logical voltage level before utilized by a CDR (Clock and Data Recovery) circuit to recover both the original clock signal and the optically transferred data. A multi-stage amplifier is often employed to amplify the small signal output of the photodetector to a logical voltage level. The front end of the multi-stage amplifier usually a transimpedance amplifier. A transimpedance amplifier provides a small-signal output voltage signal in response to a small-signal input current signal. As one example, the output voltage signal of a transimpedance amplifier may have an amplitude in the range of 100 mV. Because this voltage swing is usually inadequate to drive a CDR circuit, further amplification is usually provided by a limiting and saturating post-amplifier.

Currently, high speed optical communication links involve data rates high than 10 Gb/s (bits-per-second). The bandwidth of a transimpedance amplifier is typically chosen to be equal to about 0.7 times the bit-rate, which is a compromise between the total integrated noise and the intersymbol interference resulting from the limited bandwidth. For example, a 14 GHz bandwidth transimpedance amplifier may be desirable for a 20 Gb/s optical link. Furthermore, the number of photons integrated in the photo detector during one clock cycle and the resulting number of electrons generated by the photodetector is relatively low. As a result, there is a need for high gain, high bandwidth transimpedance amplifiers. In the past, such transimpedance amplifiers have often been realized by expensive and high power consumption Si-bipolar or III–V semiconductor technologies. But for a low cost solution, it would be desirable to realize high gain, high bandwidth transimpedance amplifiers utilizing CMOS (Complementary Metal Oxide Semiconductor) technology.

DESCRIPTION OF EMBODIMENTS

Figure 1:
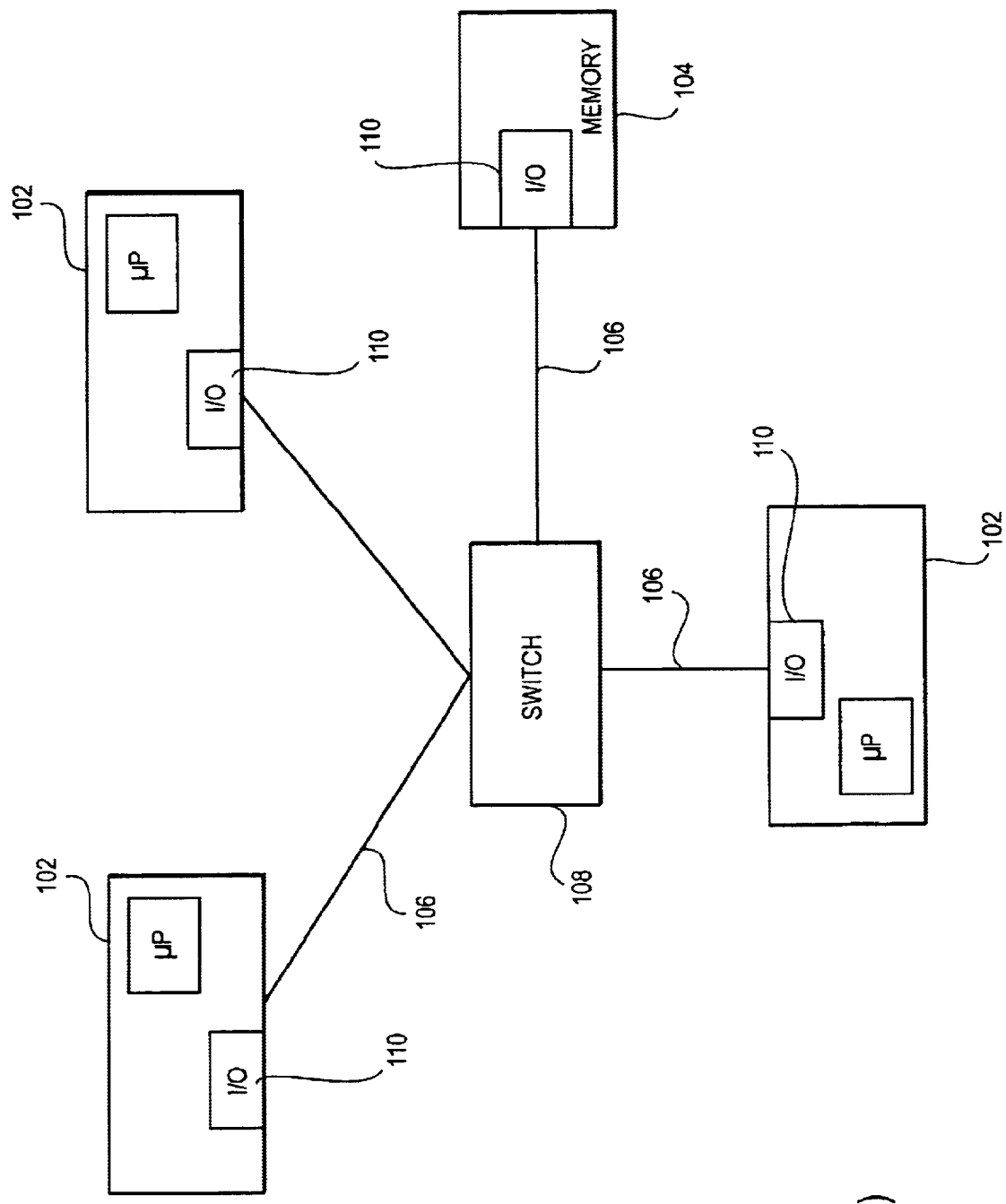
FIG. 1 is a high-level abstraction of a computer system utilizing optical signals and interconnects for board-to-board communication.
Figure 2:
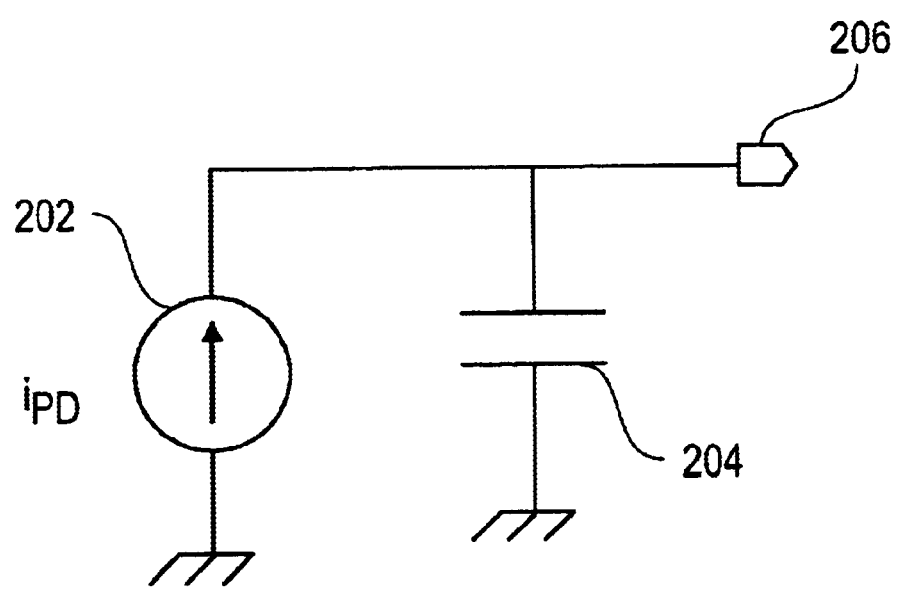
FIG. 2 is a simplified small-signal model of a photodetector.
Figure 3:
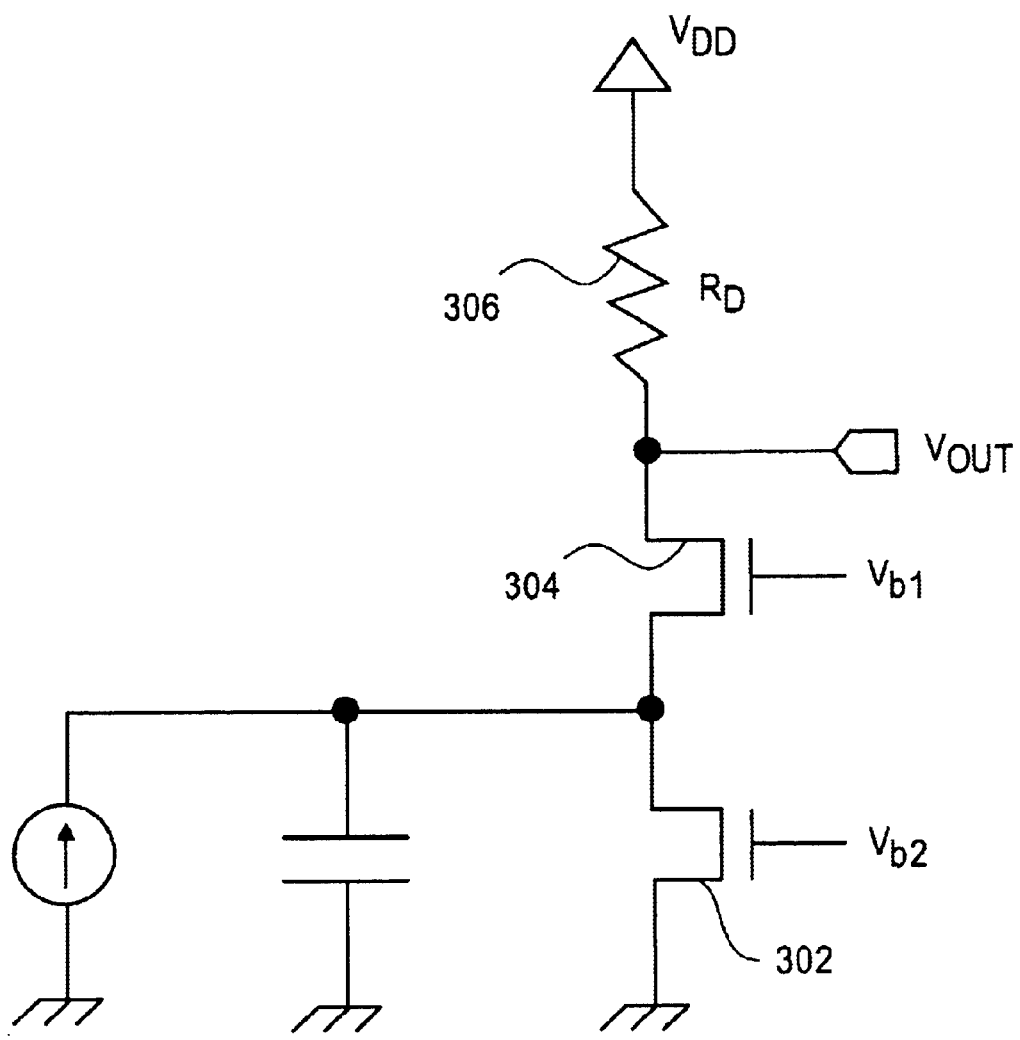
FIG. 3 is a prior art common-gate, single stage transimpedance amplifier.

Before describing the embodiments of the present invention, it is useful as a matter of comparison to describe some existing circuit topologies. Circuit topologies for transimpedance amplifiers usually rely on either a common-gate single stage amplifier, or a shunt-shunt feedback single stage that may be followed by one or more simple voltage amplifier stages. An example of a common-gate single stage amplifier is shown in FIG. 3, where the small-signal model of FIG. 2 is also shown. Common-source transistor 302 has its gate biased to a bias voltage $V_{b2}$ and common-gate cascode transistor 304 has its gate biased to a bias voltage $V_{b1}$. Load 306 may be a high-output impedance current source. The common-gate amplifier of FIG. 3 provides a relatively low input impedance, a wide bandwidth, and a well behaved time response. However, its input referred noise is relatively high (the current gain is approximately unity), and thus any current at the output is directly referred back to the input without reduction.

Figure 4A:
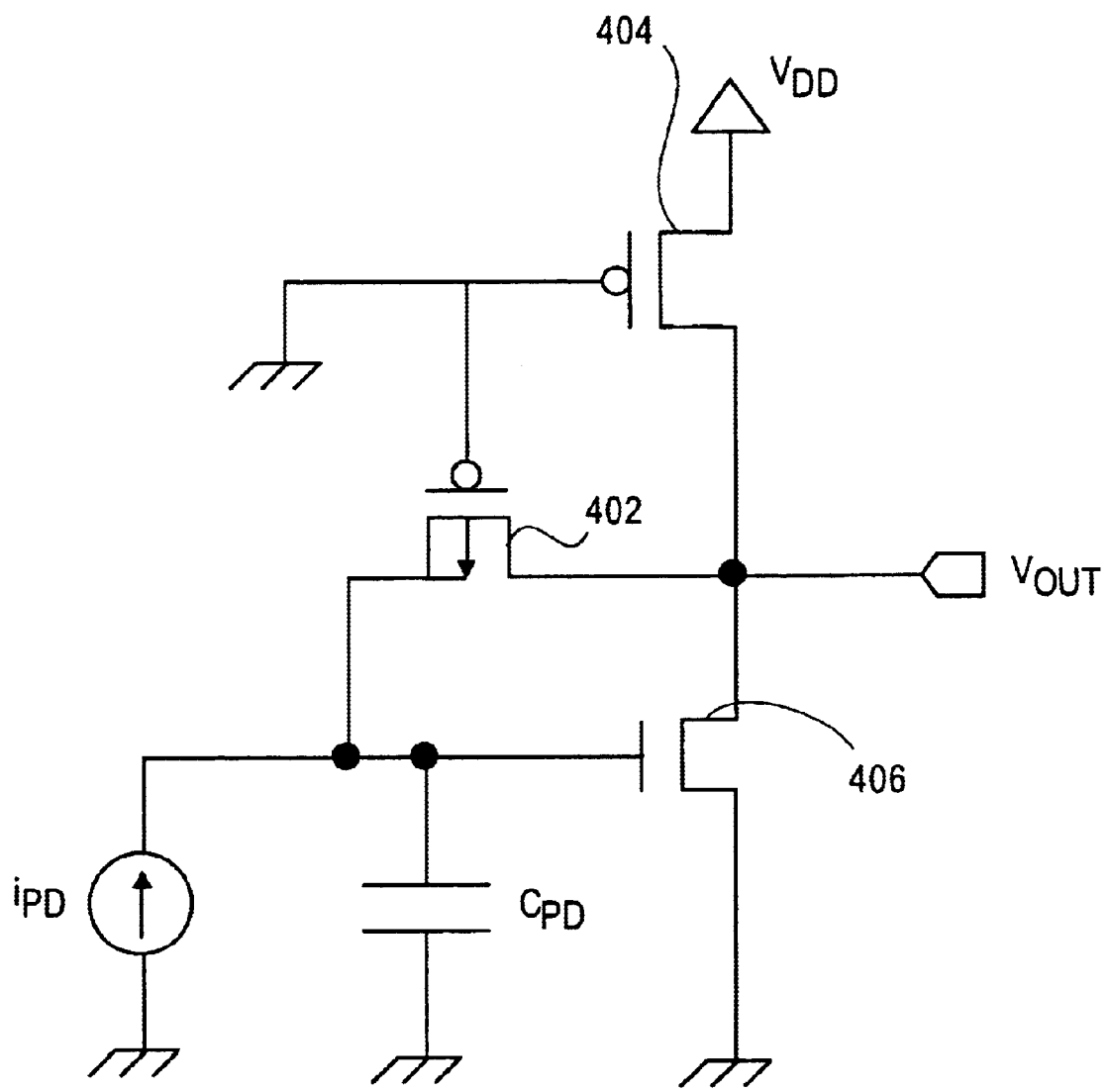
FIGS. 4a and 4b are prior art common-source, shunt-shunt, single stage transimpedance amplifiers.
Figure 4B:
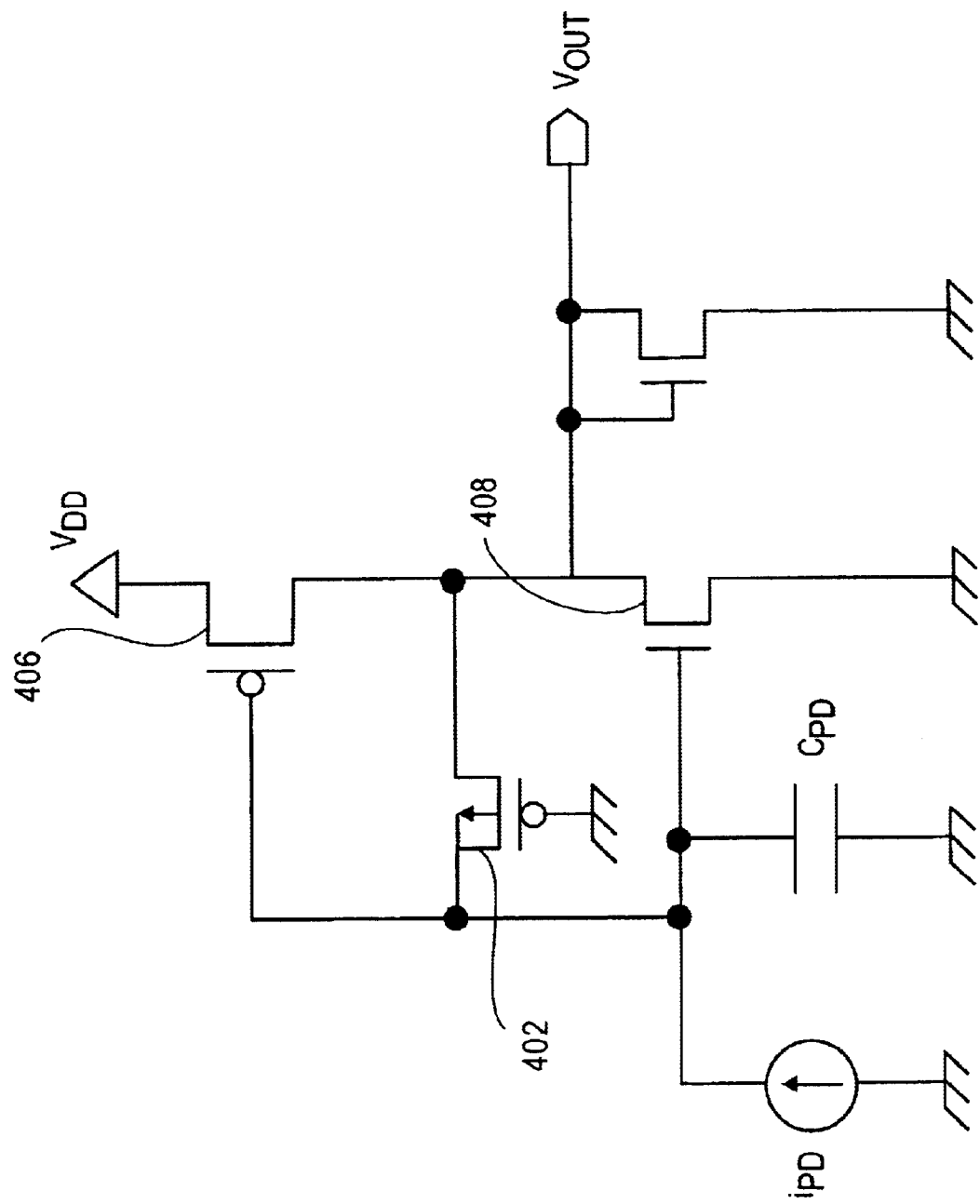

Examples of shunt-shunt feedback amplifiers are shown in FIGS. 4a and 4b, where negative feedback is provided by pMOSFET 402. Other feedback elements may be used. For example, a resistor or nMOSFET may be used in place of pMOSFET 402. Also, resistors may be used in place of pMOSFET 404 or pMOSFET 406 to load nMOSFET 406 or nMOSFET 408, respectively. Under reasonable assumptions, the low-frequency transimpedance of these amplifiers is the small-signal resistance of pMOSFET 402 (or the resistance of a resistor if so used). The ON resistance of pMOSFET 402 (or resistance if a resistor is used) sets the bias condition of the amplifier stage, and provides a current path for the photodetector.

Figure 5:
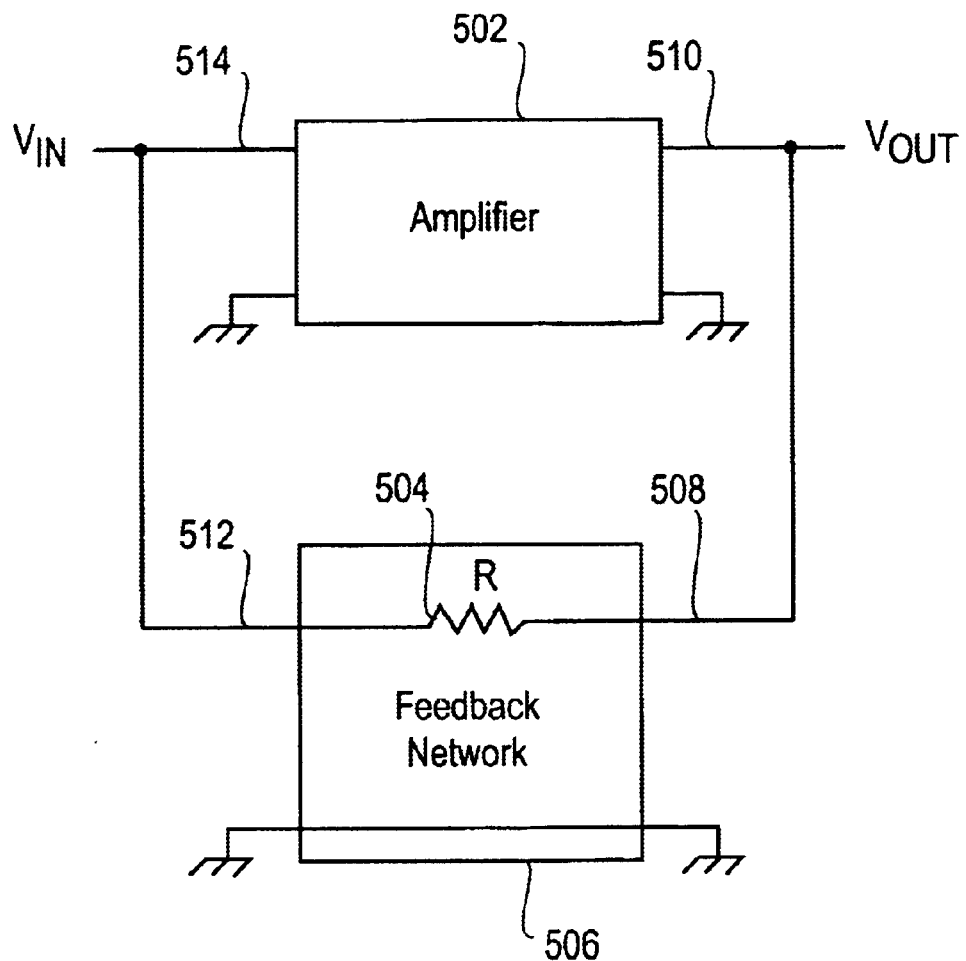
FIG. 5 abstracts the feedback topology of the shunt-shunt amplifiers in FIGS, 4a, 4b, 6, and 7.

The feedback structure used in FIGS. 4a and 4b may be abstracted as shown in FIG. 5. Amplifier block 502 is a voltage amplifier without feedback, for example, the circuit of either FIG. 4a or FIG. 4b in which pMOSFET 402 and the photodetector circuit (current source and capacitor) are not present. Resistor 504 in feedback network 506 represents the small-signal resistance of pMOSFET 402, or simply a resistor if so used in place of pMOSFET 402 in the amplifiers of FIGS. 4a and 4b. From FIG. 5, it is seen that the port of feedback network 506 comprising conductor 508 and ground is connected in shunt across the output port (conductor 512 and ground) of amplifier block 502, and the port of feedback network 506 comprising conductor 512 and ground is connected in shunt across the input port (conductor 514 and ground) of amplifier block 502. This is the reason for referring to the structures of FIGS. 4a and 4b as shunt-shunt feedback amplifiers. The shunt-shunt feedback topology of FIGS. 4a and 4b achieves a more relaxed noise-headroom tradeoff than that of FIG. 3.

Figure 6:
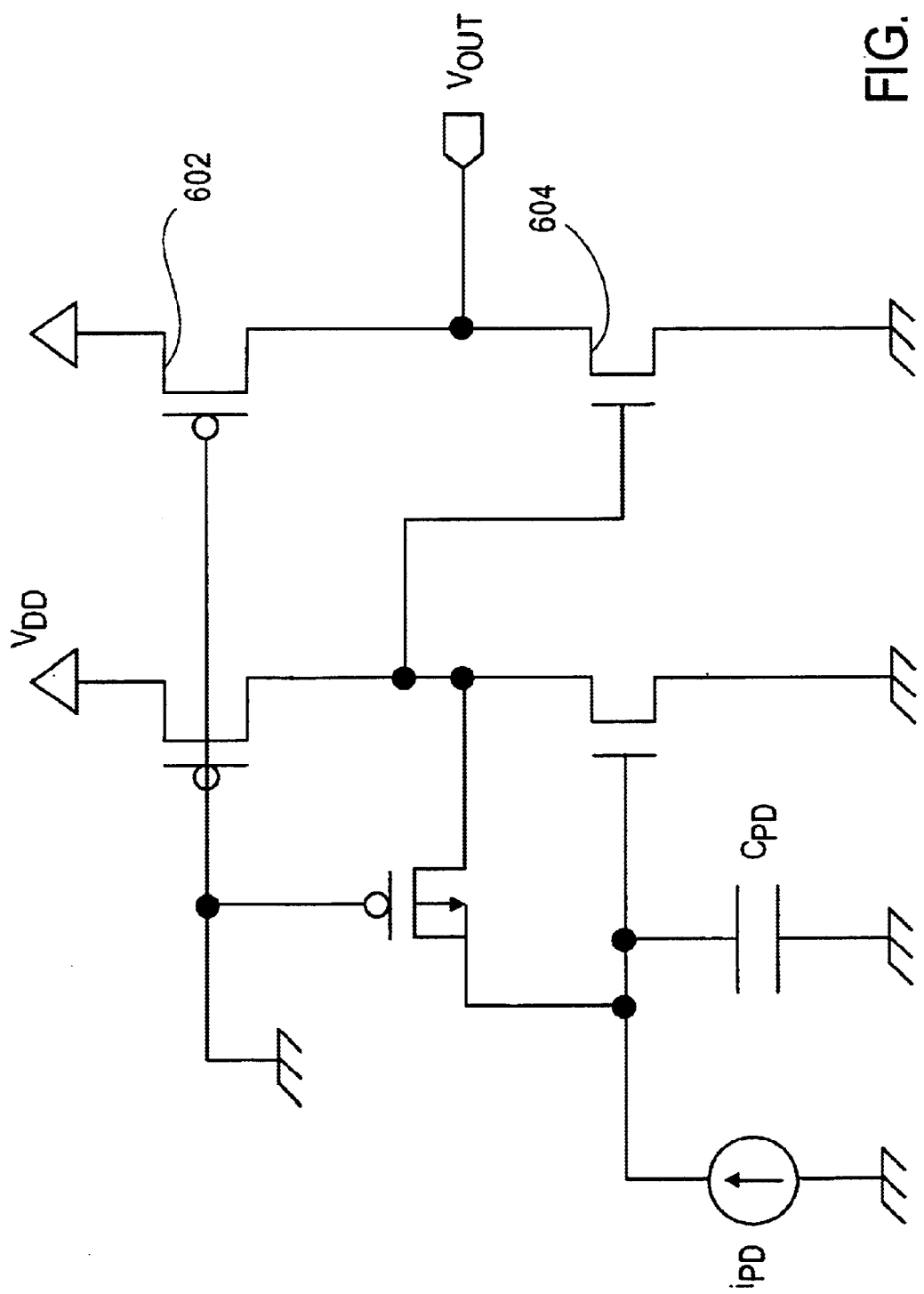
FIG. 6 is a prior art transimpedance amplifier comprising a first stage based on the amplifier of FIG. 4a and a second stage comprising a common-source voltage amplifier.
Figure 7:
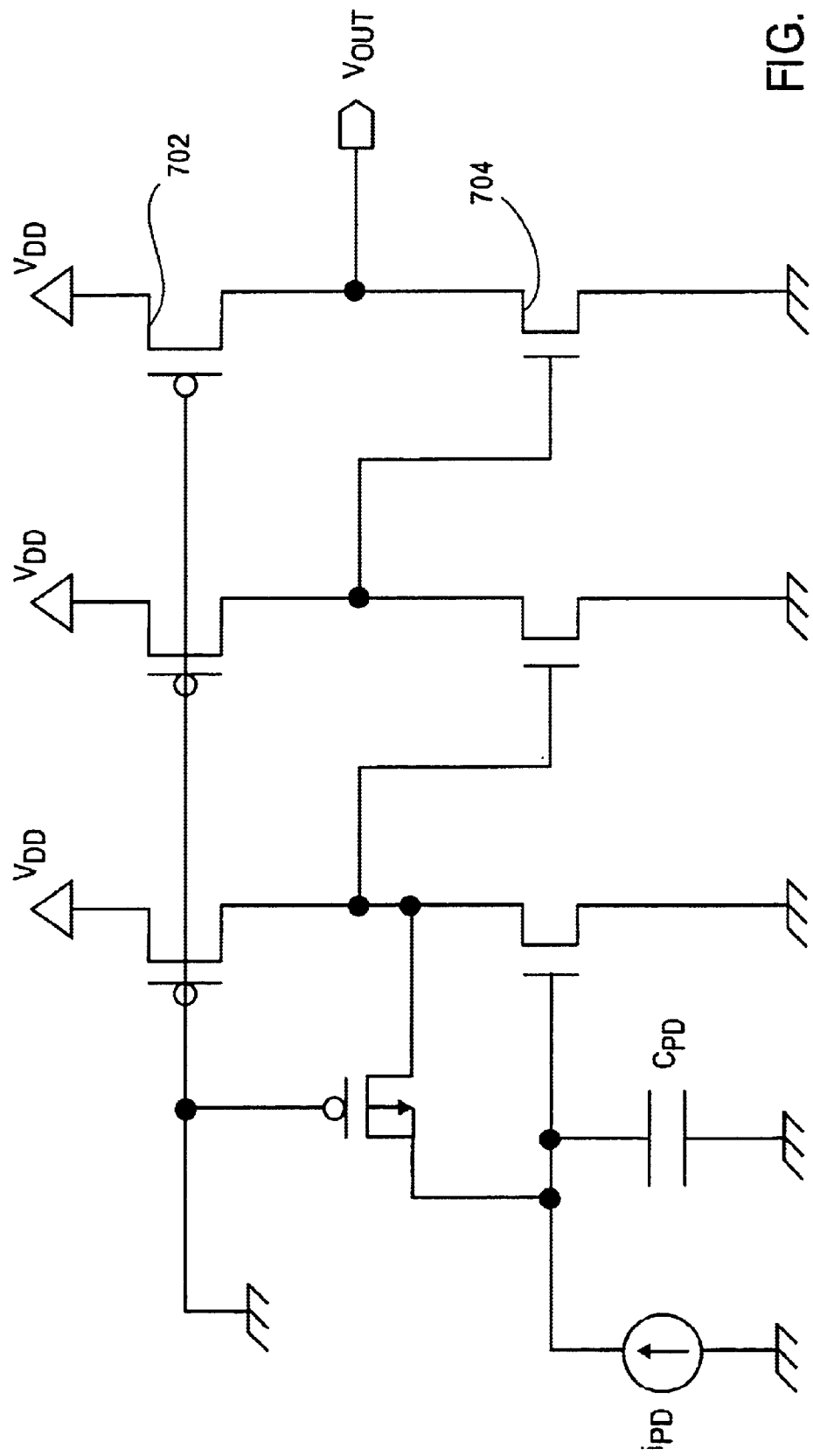
FIG. 7 is a prior art transimpedance amplifier comprising the amplifier of FIG. 6 followed by a third stage comprising a common-source voltage amplifier.

Additional voltage amplifier stages have been added to the shunt-shunt feedback topologies of FIGS. 4a and 4b. For example, in FIG. 6, a voltage amplifier stage comprising pMOSFET 602 and nMOSFET 604 is added to the shunt-shunt feedback amplifier of FIG. 4a. Similarly, in FIG. 7, a voltage amplifier stage comprising pMOSFET 702 and nMOSFET 704 is added to the circuit of FIG. 6. The added voltage amplifier stage may be viewed as a simple "single" transistor stage, because the small-signal model for the common-gate, common-source pMOSFET 602 (or equivalently pMOSFET 702) is simply a resistor loading the drain of nMOSFET 604 (or equivalently nMOSFET 702). Adding additional such single transistor voltage amplifier stages increases transimpedance at the expense of reduced bandwidth and stability.

Figure 8:
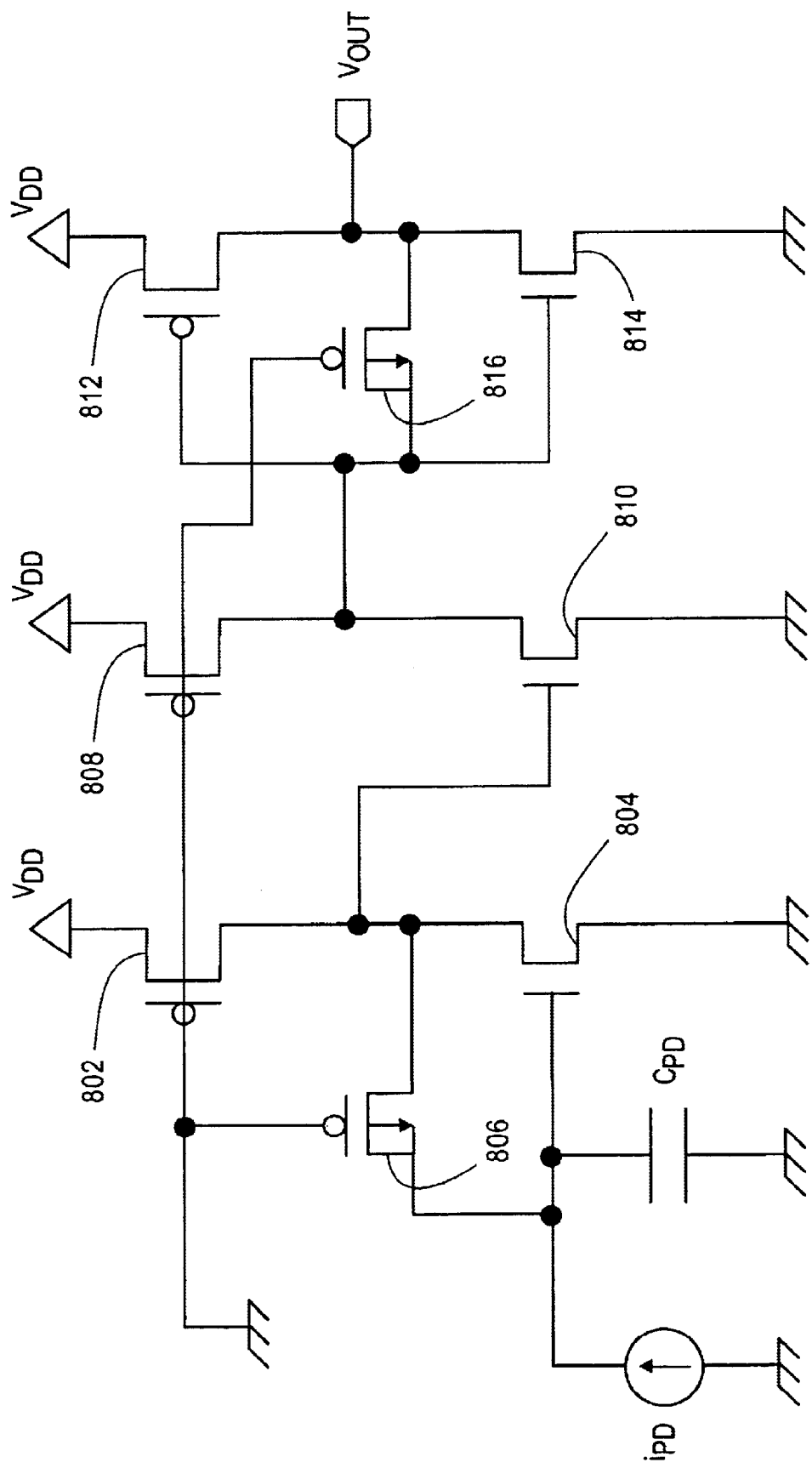
FIG. 8 is an embodiment of the present invention.

An embodiment of the present invention at the circuit level is shown in FIG. 8. The embodiment of FIG. 8 has a first shunt-shunt feedback stage comprising pMOSFET 802 loading nMOSFET 804 and feedback pMOSFET 806, a simple "single"transistor voltage amplifier stage comprising pMOSFET 808 loading nMOSFET 810, and a second shunt-shunt feedback stage comprising serially connected pMOSFET 812 and nMOSFET 814 with their gates connected together and comprising feedback pMOSFET 816.

The second shunt-shunt feedback stage in the embodiment of FIG. 8 extends the bandwidth of the transimpedance amplifier while increasing its transimpedance. A performance analysis of the two-stage transimpedance amplifier of FIG. 6 when compared to the embodiment of FIG. 8, using identical transistor sizes, shows that the addition of the second shunt-shunt feedback stage may more than double the –3 db bandwidth. One analysis has shown a 2.2 times increase in –3 db bandwidth. When compared to the three-stage amplifier of FIG. 7, the bandwidth may increase even more. One analysis has shown a 2.4 times increase in –3 db bandwidth for the embodiment of FIG. 8 when compared to the three-stage amplifier of FIG. 7.

Figure 9:
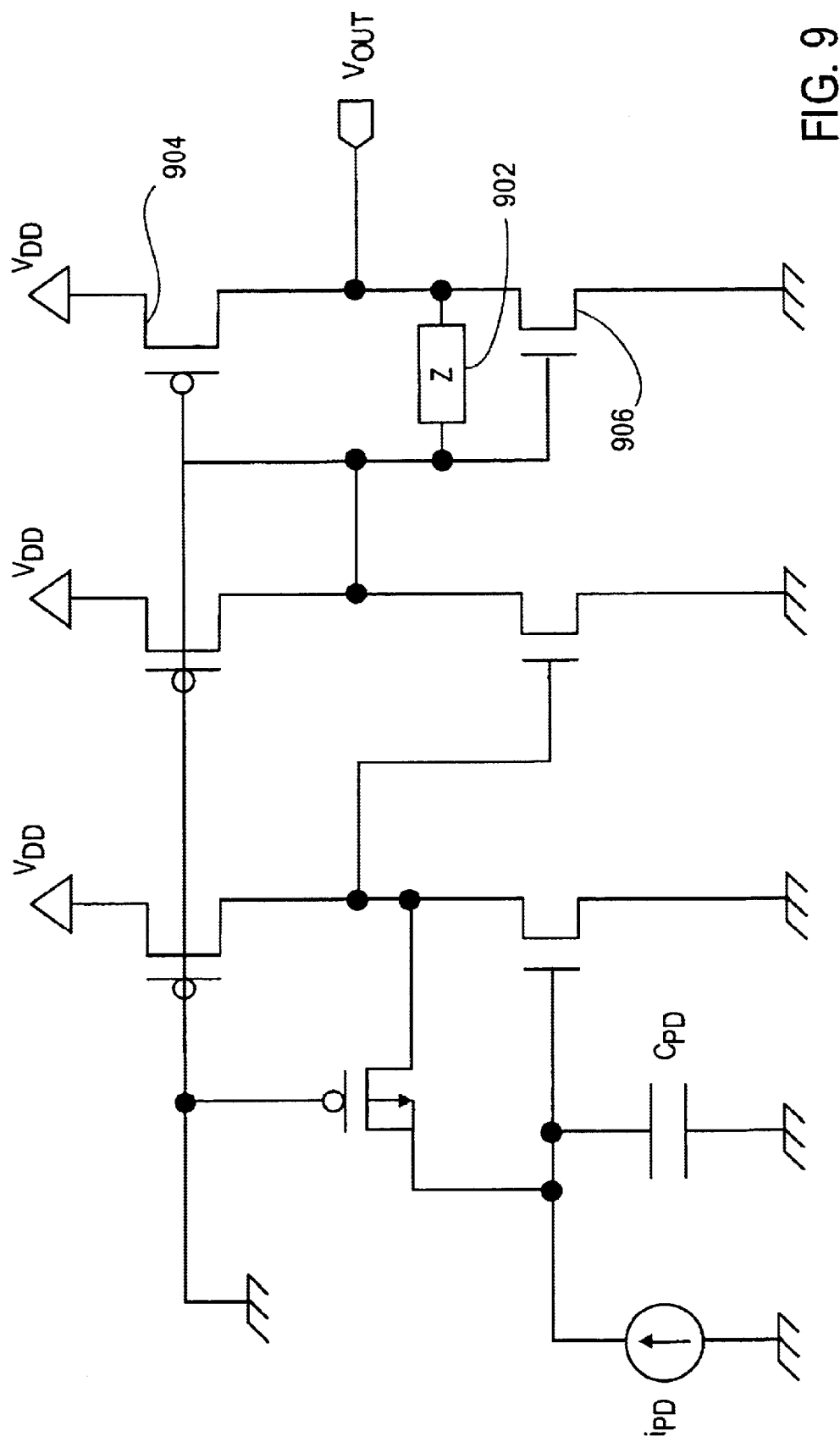
FIG. 9 is another embodiment of the present invention.
Figure 10:
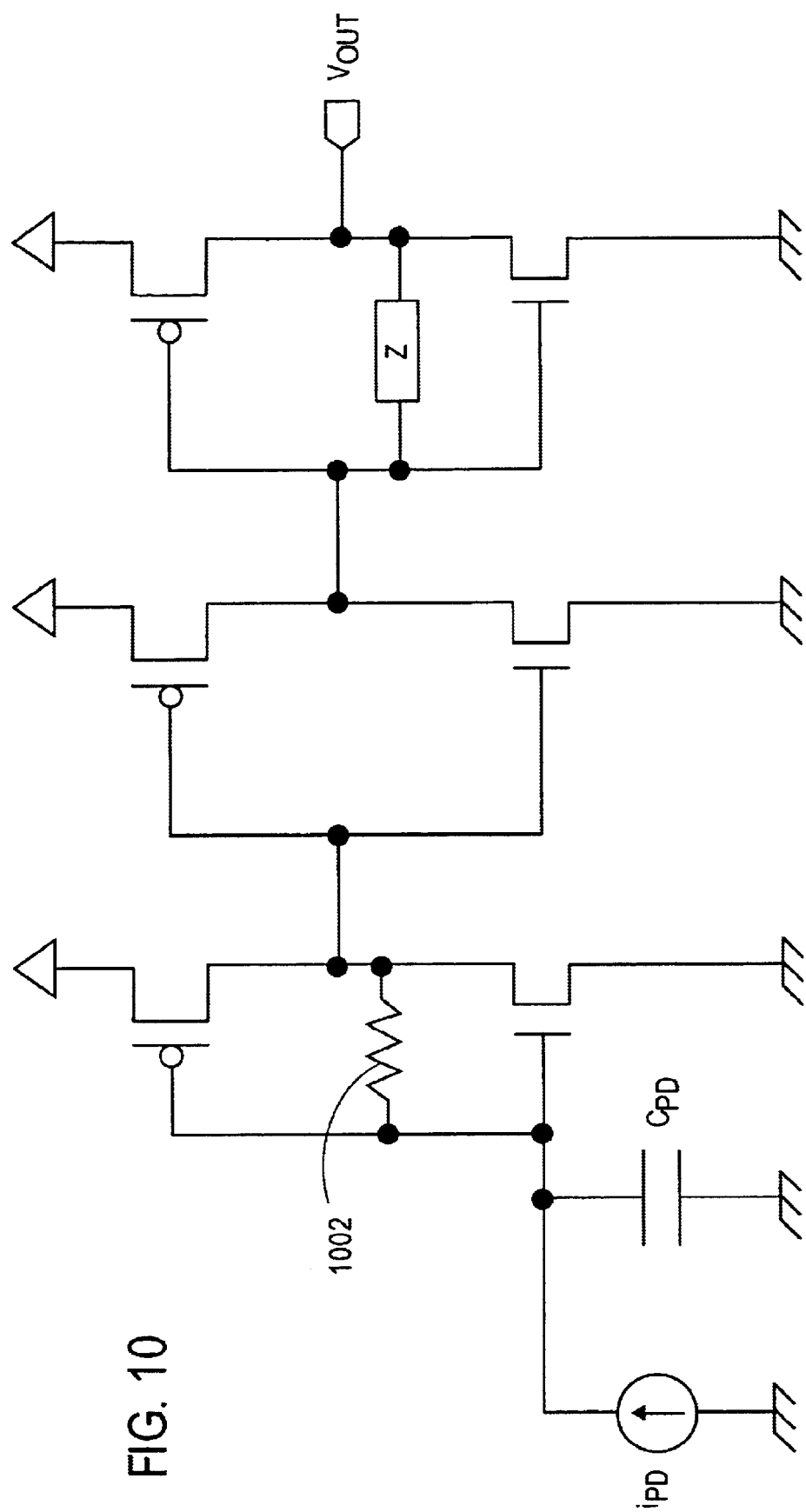
FIG. 10 is another embodiment of the present invention.

Variations and modifications to the disclosed embodiments may be made without departing from the scope of the invention as claimed below. For example, all pMOSFETs in FIG. 8, with the exception of pMOSFET 812, may be replaced with resistors. The pMOSFETs used for feedback may be replaced by general feedback elements. Such an element may be a network comprising transistors, resistors, capacitors, and inductors. For example, in FIG. 9 feedback element 902 provides negative feedback from the drains of pMOSFET 904 and nMOSFET 902 to their gates, and is represented by an impedance Z that may be complex-valued. As an example, a feedback element may be a resistor (or transistor) in parallel with a capacitor to provide negative feedback as well as to help make the circuit stable. Other embodiments may have other types of first and second stages. For example, the embodiment in FIG. 10 has inverter amplifiers for the first two stages, where the first stage has negative feedback using resistor 1002, although a more general feedback element may be used. In other embodiments, one or more shunt-shunt feedback stages may be loaded by a diode-connected nMOSFET or pMOSFET to increase –3 db bandwidth at the expense of reduced gain, as for example the shunt-shunt feedback amplifier of FIG. 4b.

What is claimed is:

1. An amplifier comprising:
   a first shunt-shunt feedback stage;
   a voltage amplifier stage coupled to the first shunt-shunt feedback stage; and
   a second shunt-shunt feedback stage coupled to the voltage amplifier stage.

2. The amplifier as set forth in claim 1, wherein the second shunt-shunt feedback stage comprises:
   a pMOSFET comprising a drain and a gate;
   a nMOSFET comprising a gate, and comprising a drain connected to the drain of the pMOSFET; and
   a feedback element coupling the drains of the pMOSFET to the gates of the pMOSFET and the nMOSFET.

3. The amplifier as set forth in claim 2, wherein the gates of the pMOSFET and the nMOSFET are connected to each other.

4. The amplifier as set forth in claim 3, wherein the first shunt-shunt feedback stage comprises:
   a pMOSFET comprising a drain;
   a nMOSFET comprising a drain connected to the drain of the pMOSFET of the first shunt-shunt feedback stage; and
   a feedback element coupling the drain of the nMOSFET of the first shunt-shunt feedback stage to the gate of the nMOSFET of the first shunt-shunt feedback stage.

5. The amplifier as set forth in claim 4, wherein the voltage amplifier stage comprises:
   a pMOSFET comprising a drain; and
   a nMOSFET comprising a drain connected to the drain of the pMOSFET of the voltage amplifier stage, and comprising a gate connected to the drain of the nMOSFET of the first shunt-shunt feedback stage.

6. The amplifier as set forth in claim 5, wherein the feedback element of the second shunt-shunt feedback stage comprises a feedback pMOSFET comprising first and second source/drain terminals connected, respectively, to the drain and the gate of the nMOSFET of the second shunt-shunt feedback stage.

7. The amplifier as set forth in claim 2, wherein the feedback element of the second shunt-shunt feedback stage comprises a feedback pMOSFET comprising first and second source/drain terminals connected, respectively, to the drain and the gate of the nMOSFET of the second shunt-shunt feedback stage.

8. The amplifier as set forth in claim 5, wherein the feedback element of the second shunt-shunt feedback stage comprises a feedback resistor comprising first and second terminals connected, respectively, to the drain and the gate of the nMOSFET of the second shunt-shunt feedback stage.

9. The amplifier as set forth in claim 2, wherein the feedback element of the second shunt-shunt feedback stage comprises a feedback resistor comprising first and second terminals connected, respectively, to the drain and the gate of the n-MOSFET of the second shunt-shunt feedback stage.

10. A computer system comprising:
    a photodetector comprising an output port; and
    an amplifier comprising an input port coupled to the output port of the photodetector, the amplifier comprising:

a first shunt-shunt feedback stage;

a voltage amplifier stage coupled to the first shunt-shunt feedback stage; and a second shunt-shunt feedback stage coupled to the voltage amplifier stage.

11. The computer system as set forth in claim 10, wherein the second shunt-shunt feedback stage comprises:

a pMOSFET comprising a drain and a gate;

a nMOSFET comprising a gate, and comprising a drain connected to the drain of the pMOSFET; and a feedback element coupling the drains of the pMOSFET to the gates of the pMOSFET and the nMOSFET.

12. The computer system as set forth in claim 11, wherein the gates of the pMOSFET and the nMOSFET are connected to each other.

13. An transimpedance amplifier comprising:

a first stage comprising a common-source amplifier comprising a transistor, the transistor comprising a gate and a drain; and a feedback element coupling the drain of the transistor to the gate of the transistor to provide negative feedback;

a second stage comprising a common-source amplifier comprising a transistor, the transistor in the second stage comprising a gate connected to the drain of the transistor in the first stage and comprising a drain; and a third stage comprising:

a nMOSFET comprising a drain and comprising a gate connected to the drain of the transistor in the second stage;

a pMOSFET comprising a gate and a drain connected, respectively, to the gate and to the drain of the nMOSFET; and a feedback element coupling the drain of the nMOSFET to the gate of the nMOSFET.

14. The transimpedance amplifier as set forth in claim 13, wherein the feedback element comprises a resistor comprising a first terminal and a second terminal connected, respectively, to the drain and to the gate of the nMOSFET.

15. The transimpedance amplifier as set forth in claim 13, wherein the feedback element comprises a pMOSFET comprising a first source/drain and a second source/drain connected, respectively, to the drain and to the gate of the nMOSFET.

* * * * *

UNITED STATES PATENT AND TRADEMARK OFFICE
CERTIFICATE OF CORRECTION

PATENT NO.   : 6,828,857 B2                                                         Page 1 of 1
DATED        : December 7, 2004
INVENTOR(S)  : Paillet et al.

It is certified that error appears in the above-identified patent and that said Letters Patent is hereby corrected as shown below:

<u>Column 1,</u>
Line 52, delete "high" and insert -- higher --.

<u>Column 4,</u>
Line 17, delete "to-the" and insert -- to the --.

Signed and Sealed this

Seventeenth Day of May, 2005

JON W. DUDAS
*Director of the United States Patent and Trademark Office*